(12) United States Patent
Huang et al.

(10) Patent No.: US 7,569,451 B2
(45) Date of Patent: Aug. 4, 2009

(54) METHOD OF FABRICATING AN ISOLATION SHALLOW TRENCH

(75) Inventors: Jen-Jui Huang, Taoyuan County (TW); Hsiu-Chun Lee, Taipei (TW); Chang-Ho Yeh, Taipei (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 0 days.

(21) Appl. No.: 11/969,913

(22) Filed: Jan. 6, 2008

(65) Prior Publication Data
US 2008/0286935 A1 Nov. 20, 2008

(30) Foreign Application Priority Data
May 16, 2007 (TW) .............................. 96117409 A

(51) Int. Cl.
*H01L 21/8242* (2006.01)
(52) U.S. Cl. .................. 438/243; 438/386; 257/301; 257/E21.396

(58) Field of Classification Search ................ 438/424, 438/400, 423, 429, 430, 431, 435, 386, 387, 438/389, 391, 243; 257/E21.54, E21.536, 257/E21.532, E21.537, E21.545, E21.546, 257/301, 296, 288, 213, 305, E21.396
See application file for complete search history.

(56) References Cited

U.S. PATENT DOCUMENTS

| 5,346,586 | A * | 9/1994 | Keller | 438/694 |
| 6,258,507 | B1 * | 7/2001 | Ochiai et al. | 430/270.1 |
| 6,426,253 | B1 * | 7/2002 | Tews et al. | 438/243 |

* cited by examiner

*Primary Examiner*—Matthew Smith
*Assistant Examiner*—Michele Fan
(74) *Attorney, Agent, or Firm*—Winston Hsu

(57) ABSTRACT

A method of fabricating an isolation shallow trench contains providing a substrate with at least a deep trench, forming a cap layer on the upper portion of the deep trench, forming a crust layer on a portion of the cap layer, defining a trench extending through the cap layer and the conductive layer, and forming an isolation layer in the shallow trench.

19 Claims, 14 Drawing Sheets

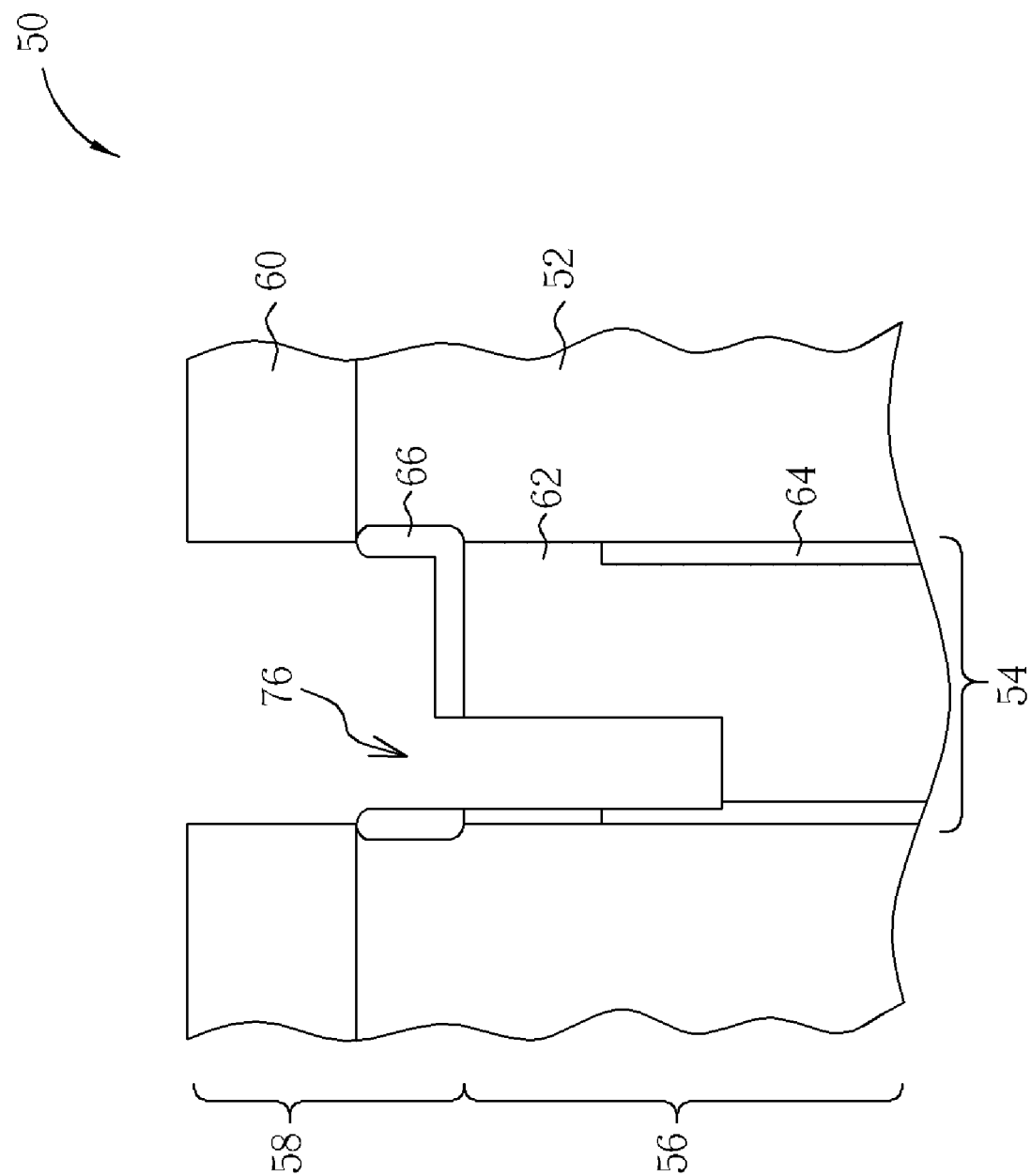

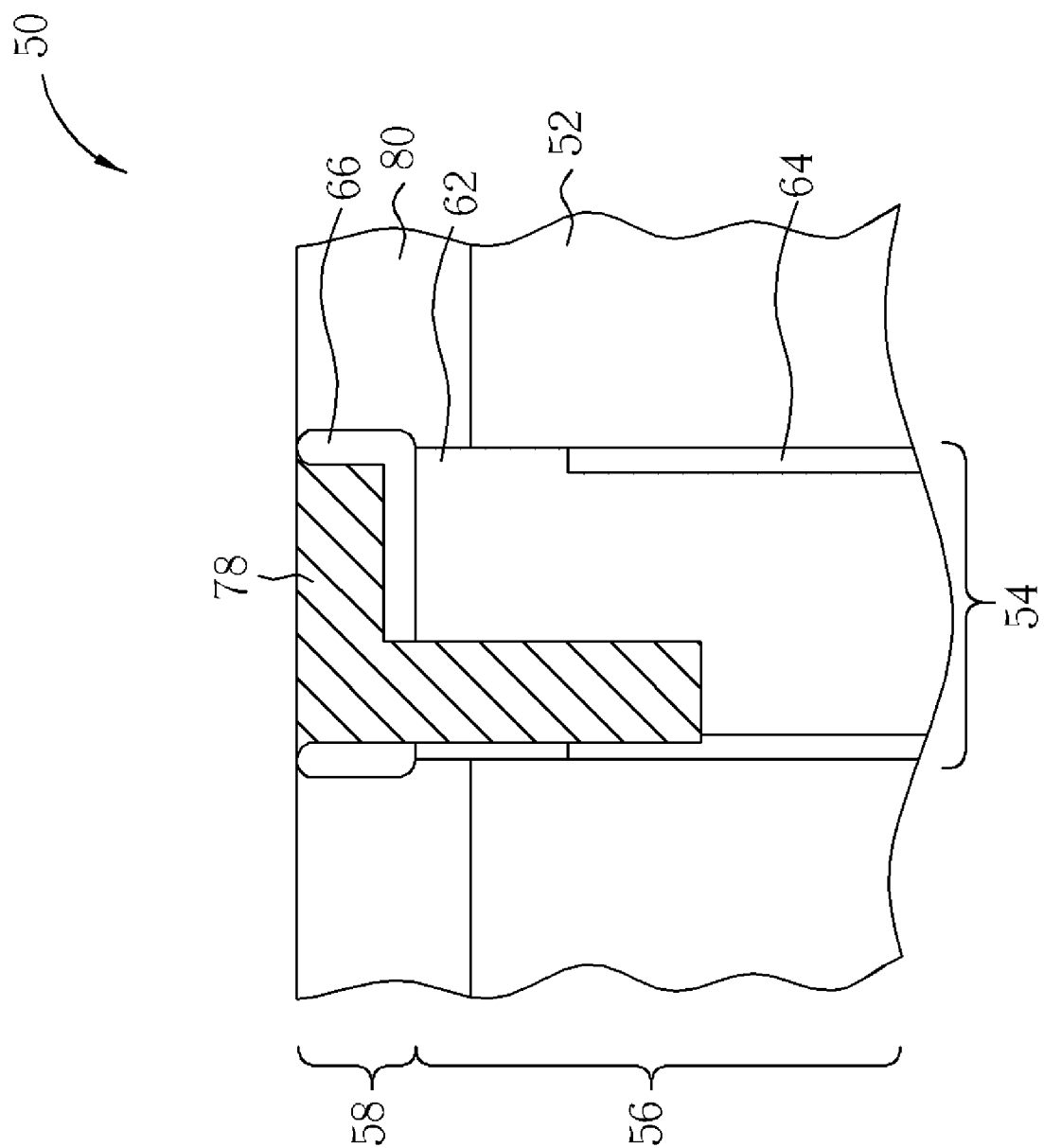

METHOD OF FABRICATING AN ISOLATION SHALLOW TRENCH

BACKGROUND OF THE INVENTION

1. Field of the Invention

The present invention relates to a method of fabricating an isolation shallow trench, and more particularly, to a method of fabricating a single side isolation shallow trench in a deep trench.

2. Description of the Prior Art

Along with the development of miniaturization of various electronic products, the design of the dynamic random access memory (DRAM) elements has to match the requirement of high integration and high density. DRAMs with trench capacitor structures have become one of the main structures of high-integrated DRAM products used in industry. This kind of DRAM contains trench capacitors fabricated inside deep trenches that are formed in a semiconductor substrate by an etching process so as to effectively reduce a size of the memory cell and utilize space of chips well. Furthermore, because the integration of the DRAM elements is becoming higher than ever, the distance between the adjacent memory cells is becoming smaller than what is available on the market. Recently, in order to prevent the defects such as electric leakage in the DRAM elements, a single side buried strap (SSBS) is designed to be formed on the trench capacitor of each memory cell and electrically connected to a source/drain of the corresponding transistor. The method of the above-mentioned structure can be practiced by forming a single side isolation shallow trench on the trench capacitor opposite to the SSBS so as to isolate the buried strap or trench capacitor from the adjacent memory cells.

FIG. 1 through FIG. 6 are schematic diagrams illustrating the method of fabricating a single side isolation shallow trench of the prior art. With reference to FIG. 1, a semiconductor device 10 including a substrate 12 is provided, and the surface of the semiconductor device 10 includes a pad layer 20 and a deep trench 14 defined in the substrate 12. The deep trench 14 includes a lower portion 16 and an upper portion 18. An oxide layer 24 is disposed on the inner surface of the sidewall of the lower portion 16 of the deep trench 14, and the inside of the deep trench 14 is filled with a conductive layer 22. A nitride layer 26 is disposed on the surface of the conductive layer 22.

Next, as shown in FIG. 2, a liner layer 27 is formed on a surface of the substrate 12, and the liner layer 27 covers the top surface of the pad layer 20, the inner side wall of the deep trench 14 and an exposed surface of the nitride layer 26. The liner layer 27 can be an amorphous silicon layer or a polysilicon layer. With reference to FIG. 3, an implant process 28 is performed to implant boron fluoride ions into the liner layer 27 with an angle α so that portions of the liner layer 27 forms a doped layer 30, as shown in FIG. 4. It is to be noted that the implant process 28 is to implant the boron fluoride ions into the liner layer 27 with a predetermined angle α, so that a portion of the liner layer 27 will not become the doped layer 30 due to said portion of the liner layer 27 being shielded by the sidewall of the deep trench 14. Sequentially, a wet etching process is performed with an etchant including ammonia to remove said portion of the liner layer 27 not becoming the doped layer 30. Therefore, an opening 32 exposing a portion of the nitride layer 26 is formed on the surface of the nitride layer 26.

Next, with reference to FIG. 5, an oxidation process is performed to make the doped layer 30 become an oxidation mask layer 34. As shown in FIG. 6, the oxidation mask layer 34 is taken as an etching mask, and an etching process is performed to the substrate 12 to remove portions of the nitride layer 26 and the conductive layer 22 not covered by the oxidation mask layer 34 so as to form a shallow trench 36 in the deep trench 14. Sequentially, an isolation shallow trench can be formed in the shallow trench 36 so as to isolate the memory cell of the deep trench 14 from the other elements on the left side of the memory cell.

As mentioned above, a size of the isolation shallow trench in the deep trench 14 is determined by the angle α of the implant process 28. The size of the isolation shallow trench will become larger as the angle α is larger. When the element integration is becoming high and the sizes of each memory cell and the deep trench 14 become small, the angle α also has to make the necessary adjustment so as to reduce the size of the isolation shallow trench accordingly. However, the implant process 28 with a small angle α has a small process window, whose process difficulty is correspondingly high. Especially when the process level advances to 90 nanometers or even under 60 nanometers, the difficulty of the above-mentioned process of the prior art is also greatly increased to affect the cost and process yield.

On the other hand, according to the process of fabricating isolation shallow trench of the prior art, the steps of the wet etching process and the oxidation process have to be performed sequentially after the implant process 28 so that the oxidation mask layer 34 utilized to fabricate the isolation shallow trench can be formed on the surface of the nitride layer 26. Accordingly, the prior-art processes are too complicated to increase the process efficiency.

Therefore, how to fabricate an isolation shallow trench having a good structure in the deep trench by a simple process with improved process window and process yield is still required for the industry.

SUMMARY OF THE INVENTION

It is therefore an primary objective of the claimed invention to provide a method of fabricating an isolation shallow trench, wherein a cap layer is filled in the upper portion of the deep trench combined with the tilt angle implanting process so that an etching mask having a pattern is formed to solve the prior art problems.

According to the claimed invention, a method of fabricating an isolation shallow trench is provided. First, a substrate is provided, and the substrate includes at least a deep trench having an upper portion and a lower portion. The lower portion of the deep trench is filled with a conductive layer. Next, a cap layer is formed on the upper portion of the deep trench, and a recess is formed with a surface of the cap layer and a sidewall of the upper portion of the deep trench. Then, a tilt angle implant process is performed to form a crust layer on the surface of a portion of the cap layer. Next, a trench extending through the cap layer and the conductive layer is defined. Last, an isolation layer is formed in the trench so as to form the isolation shallow trench.

It is an advantage of the claimed invention that a cap layer on the upper portion of the deep trench before performing the tilt angle implant process, the tilt angle implant process can be carried out with a large tilt angle to implant ions into the cap layer. Therefore, the process window can be increased, and the difficulty of the process can be reduced. Furthermore, according to the claimed invention, it only requires one etching process to form a shallow trench in the deep trench after the tilt angle implant process so as to effectively simplify the entire fabricating process and increase process yield.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 7 through FIG. 14 are schematic diagrams illustrating a process of fabricating an isolation shallow trench of the present invention.

DETAILED DESCRIPTION

Figure 1:
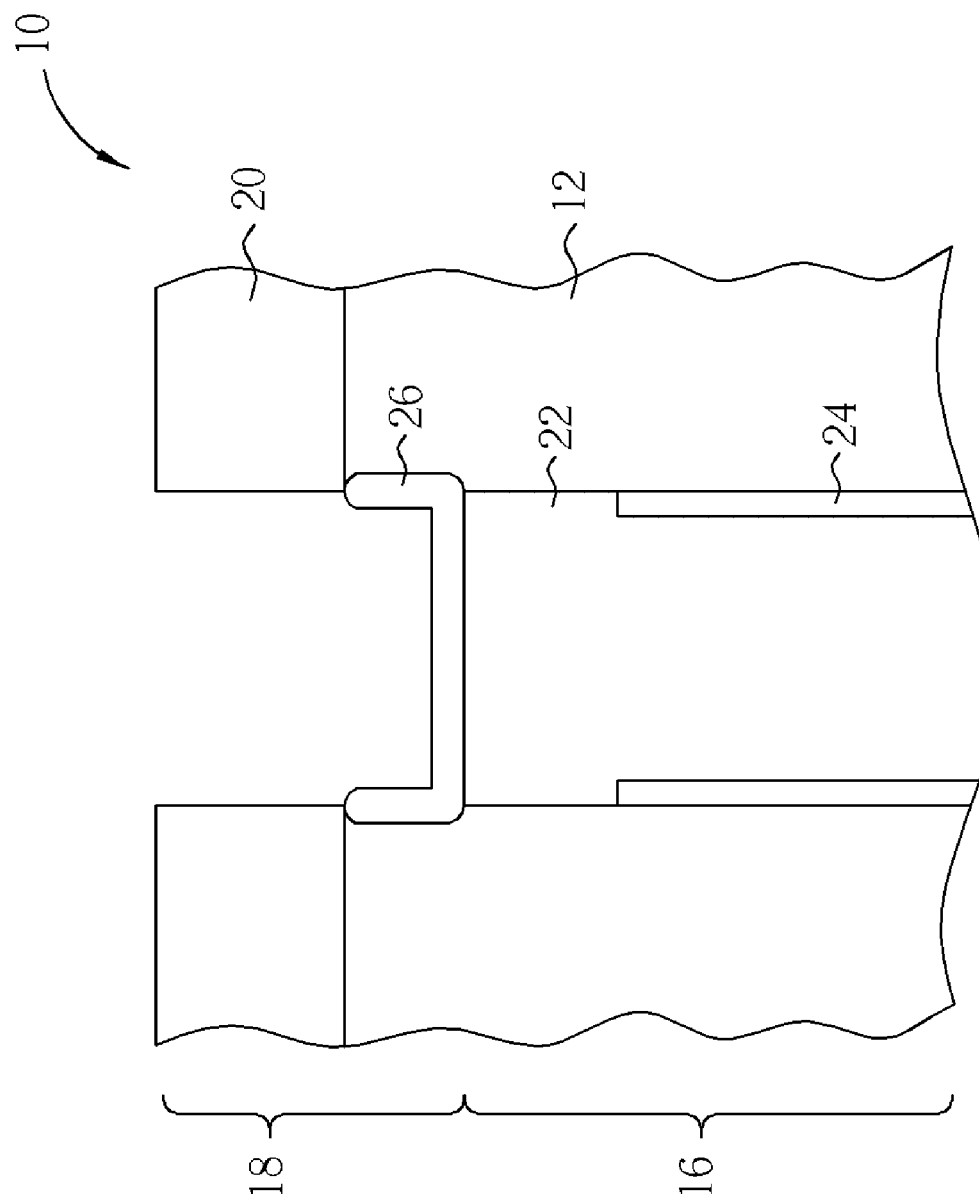
FIG. 1 through FIG. 6 are schematic diagrams illustrating a method of fabricating a single side isolation shallow trench of the prior art.
Figure 2:
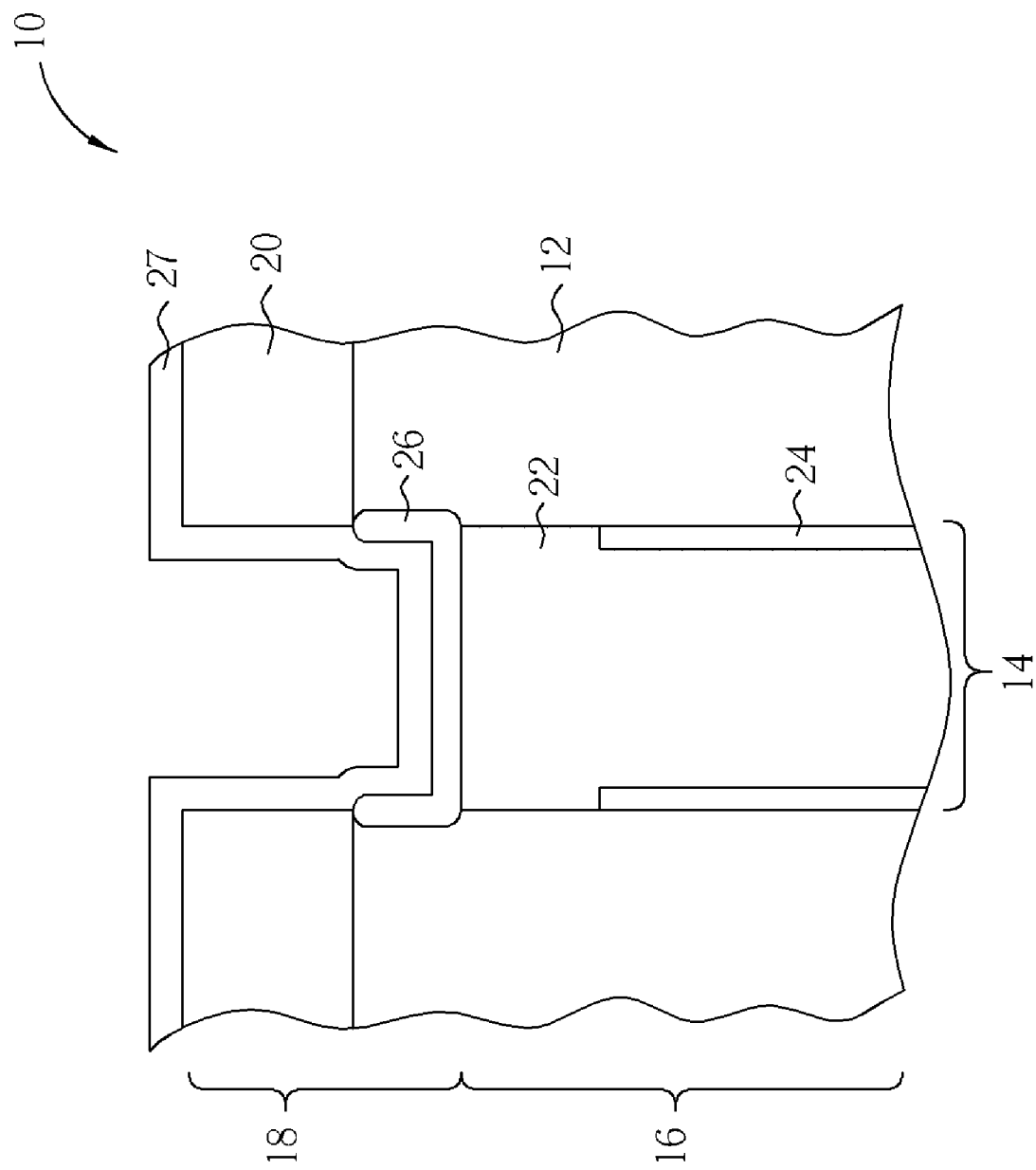
Figure 3:
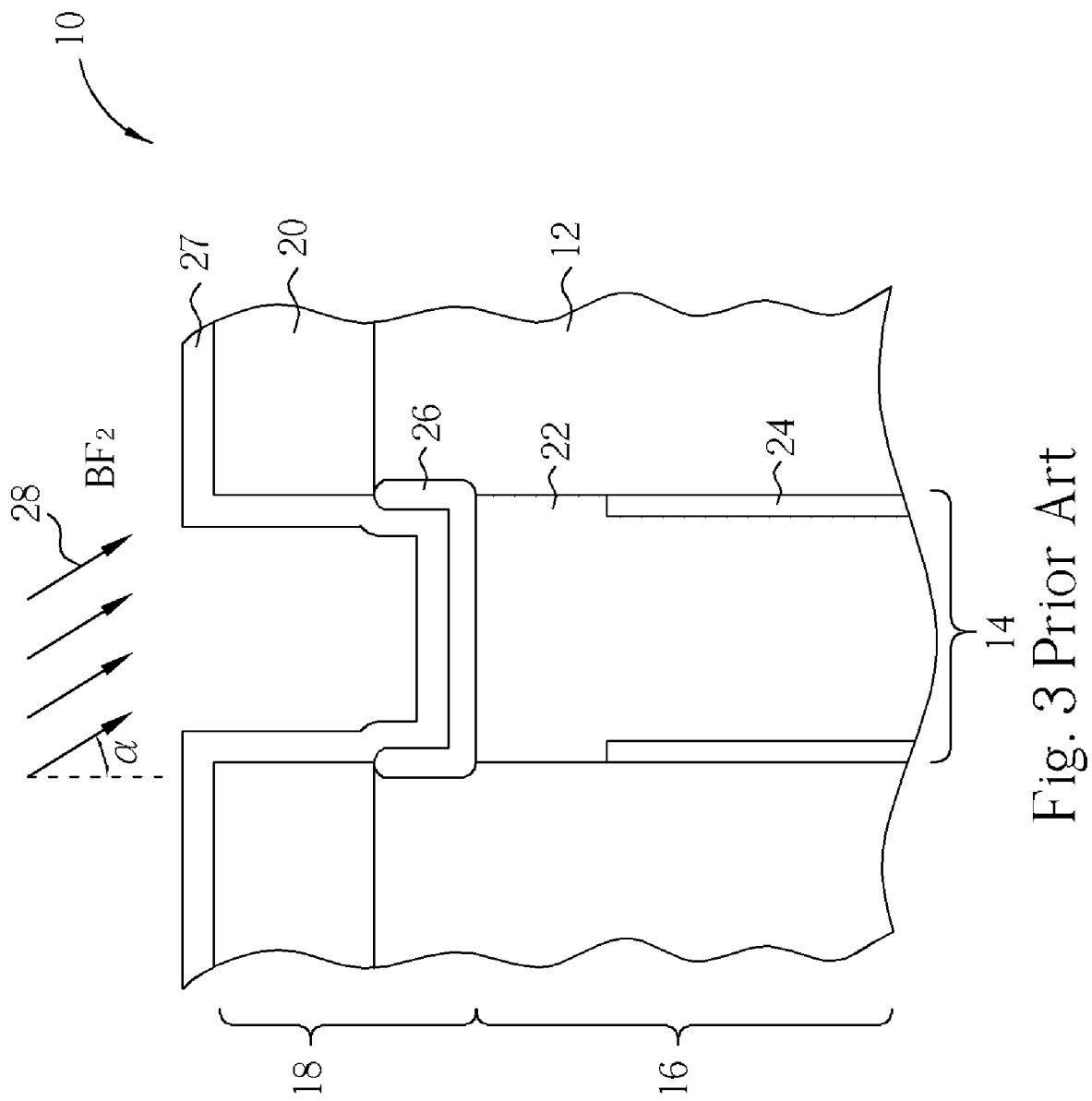
Figure 4:
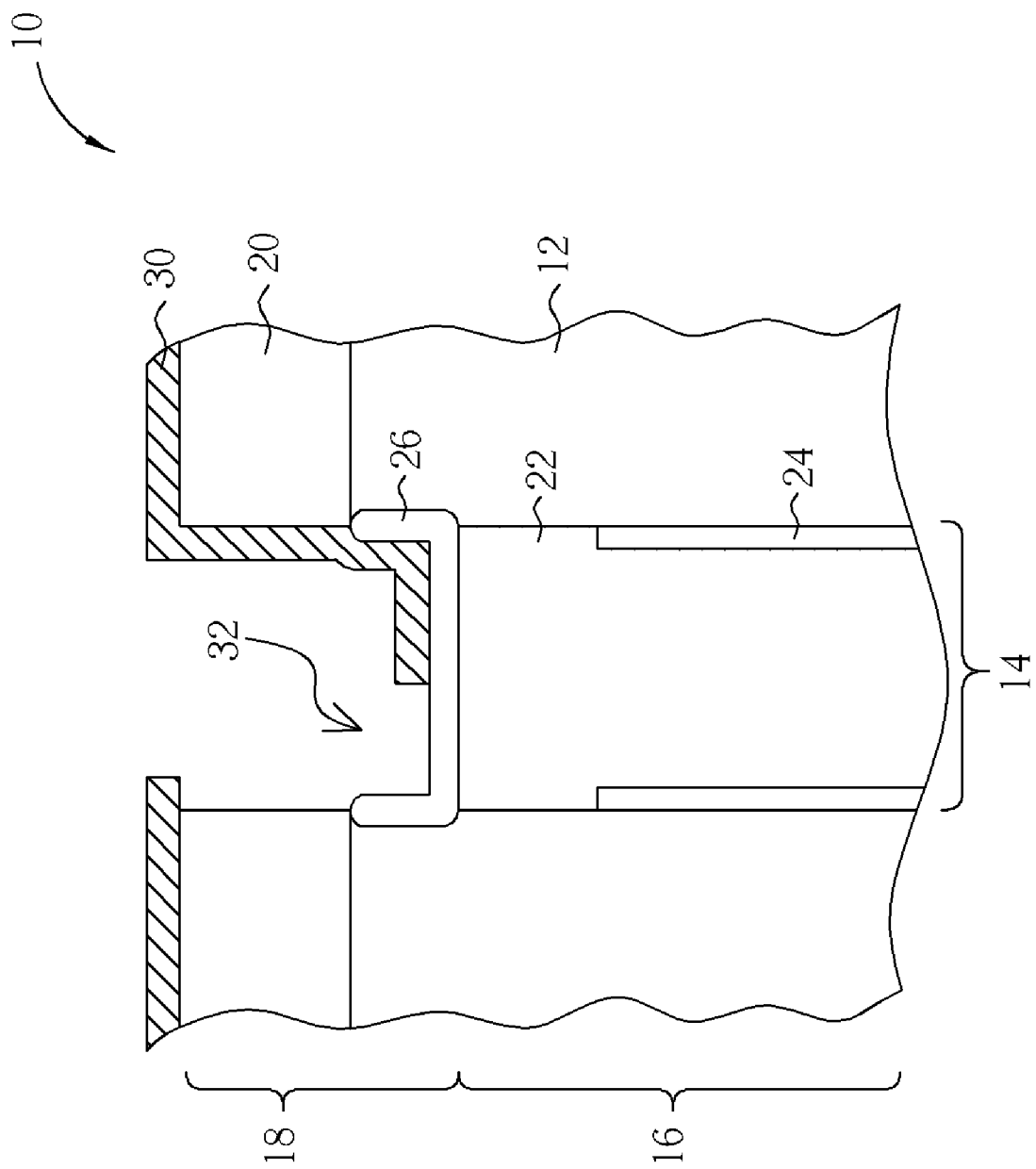
Figure 5:
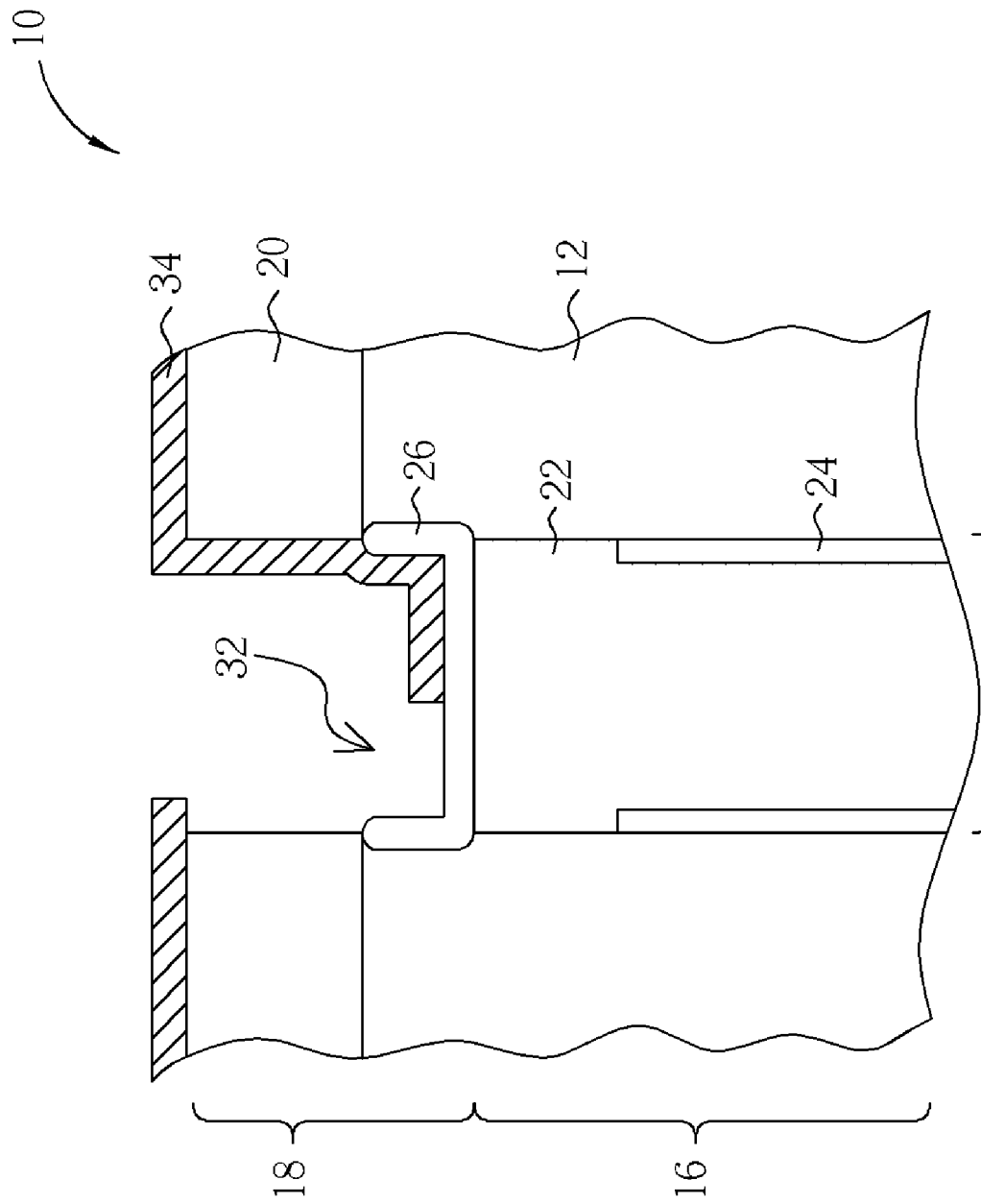
Figure 6:
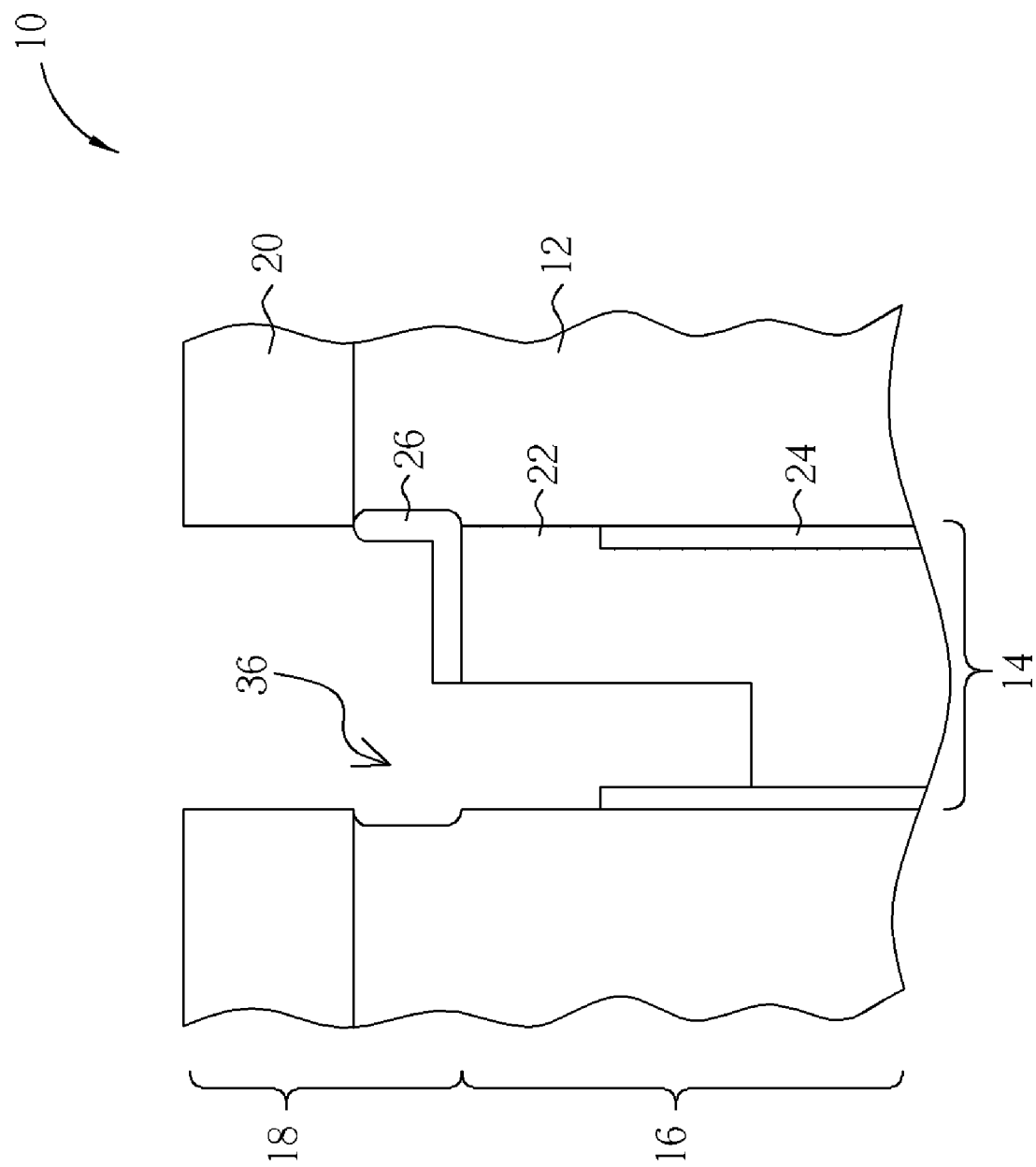
Figure 7:
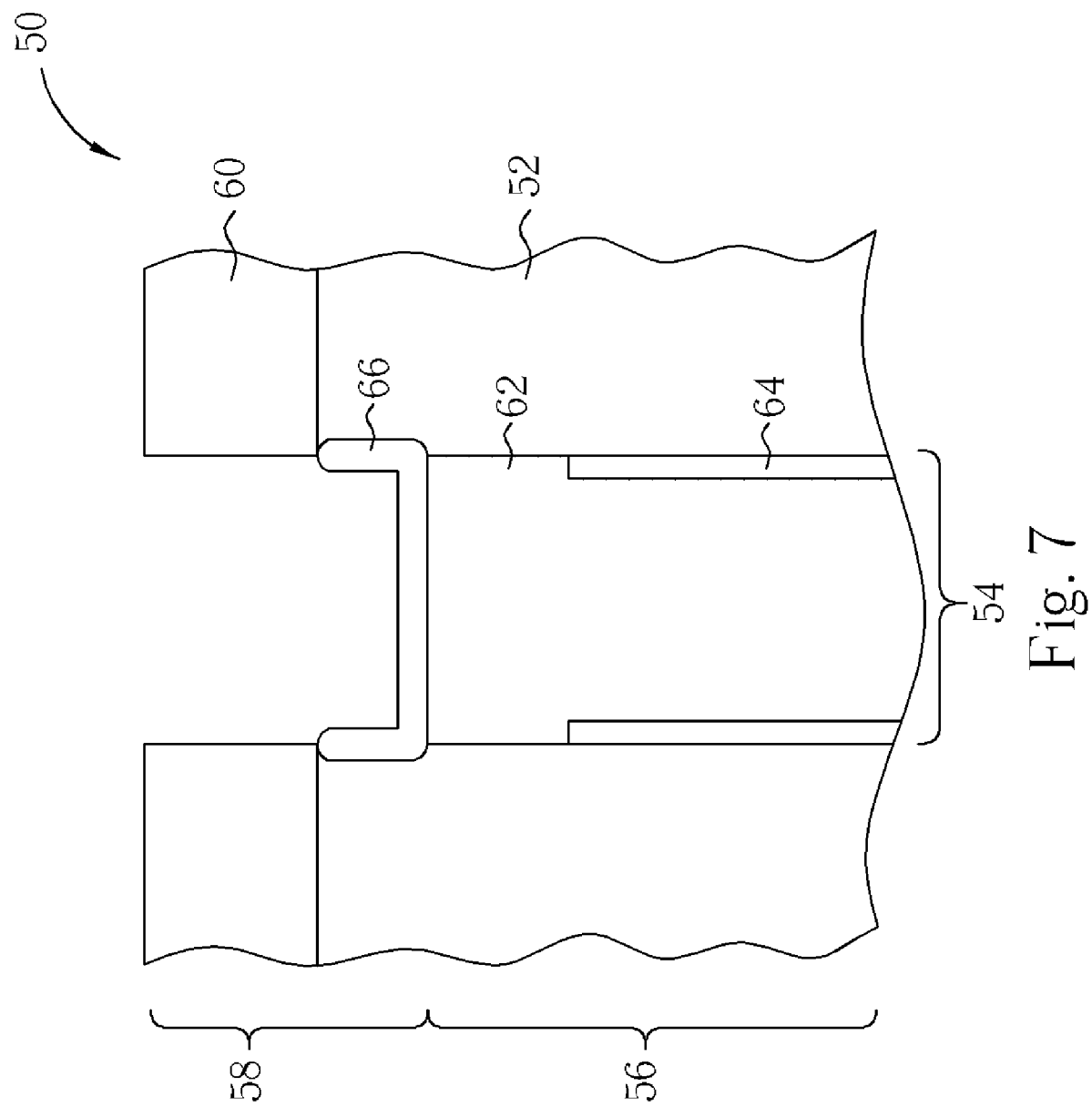

FIG. 7 through FIG. 14 are schematic diagrams illustrating a process of fabricating an isolation shallow trench of the present invention. With reference to FIG. 7, a semiconductor device 50 is provided, and the semiconductor device 50 comprises a substrate 52, such as semiconductor substrate. The substrate 52 comprises at least a deep trench 54 with a lower portion 56 and an upper portion 58, and the substrate 52 further comprises a pad layer 60 which may comprise nitride, oxide or the combination thereof. In addition, an inner surface of the lower portion 56 of the deep trench 54 has a dielectric layer 64, such as an oxide layer, disposed thereon and the inside of the lower portion 56 of the deep trench 54 is further filled with a conductive layer 62, such as a doped poly-silicon layer. The dielectric layer 64 surrounding a portion of the conductive layer 62 is also called a collar oxide layer. Then, a chemical vapor deposition (CVD) process is selectively performed to form an isolation layer 66, such as a nitride layer, on the surface of the conductive layer 62 and the inner surface of the upper portion 58 of the deep trench 54, whose thickness is about 5 nanometers for example.

Figure 8:
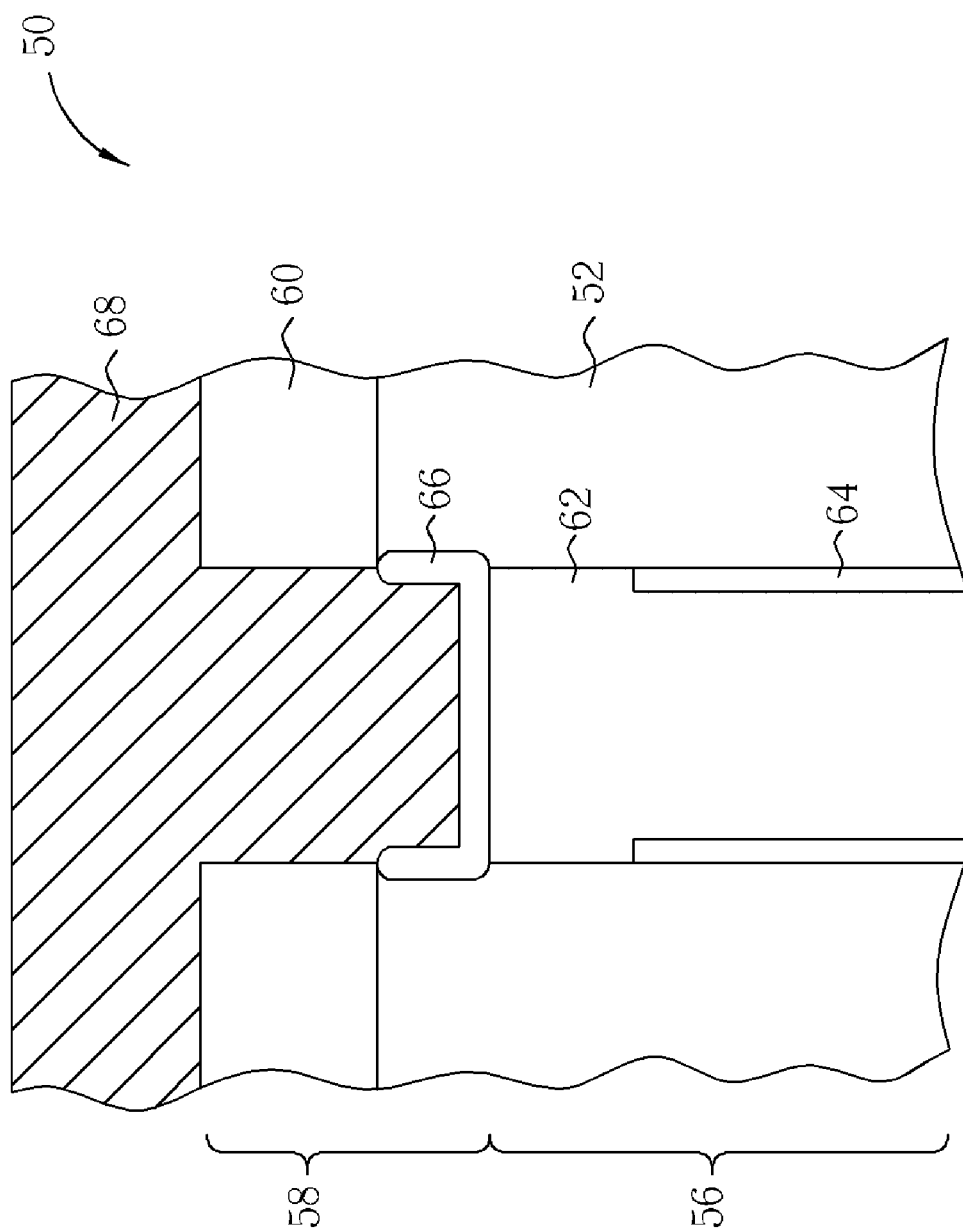
Figure 9:
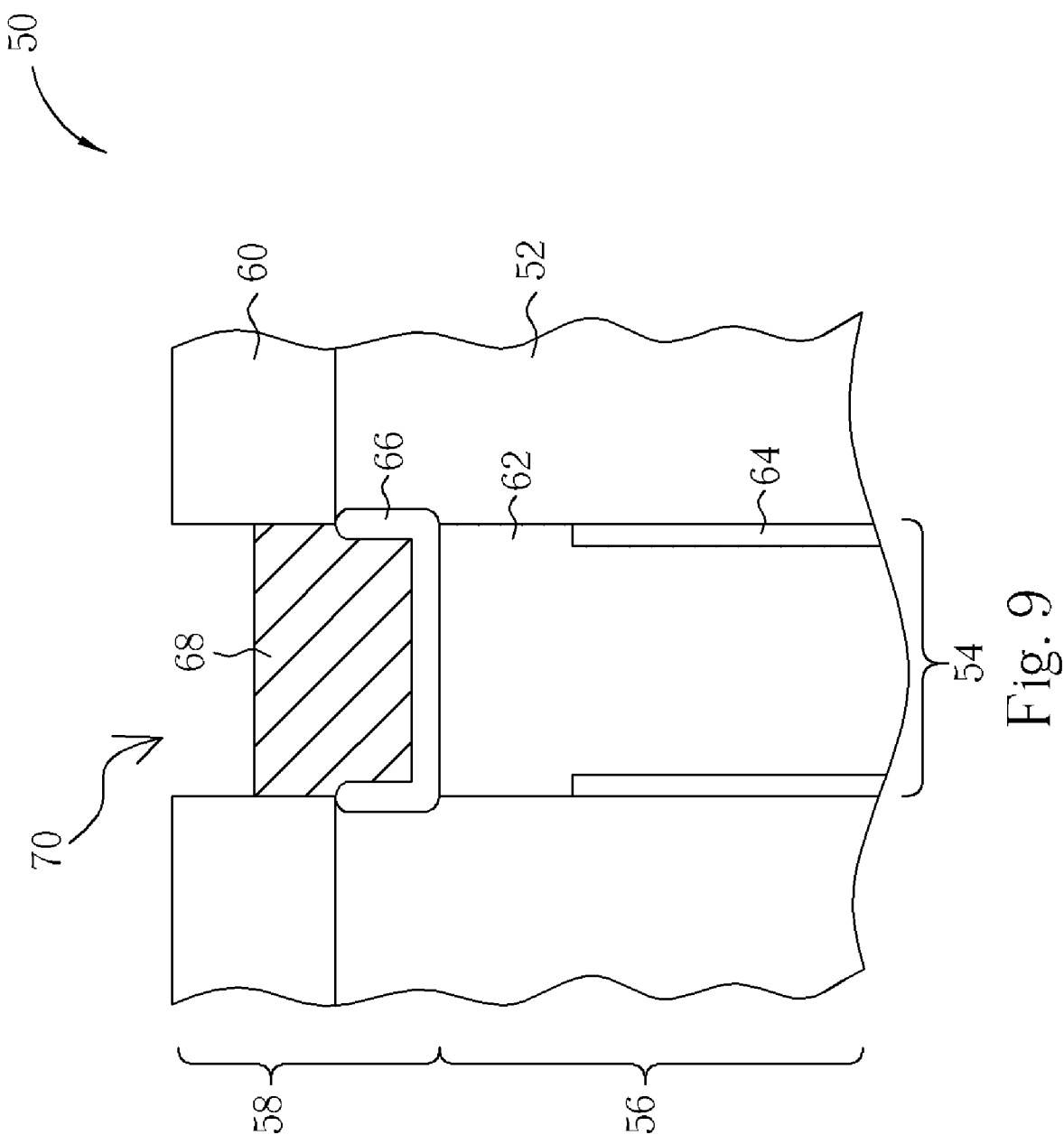

Next, with reference to FIG. 8, a cap layer 68 is formed on the upper portion 58 of the deep trench 54. The material of the cap layer 68 preferably comprises an organic material, such as a photoresist material, which is able to be formed on the surface of the substrate 52 and filled into the upper portion 58 of the deep trench 54 by a coating method. In a preferred embodiment, the cap layer 68 is able to further comprise a positive photoresist material adapted to light source being krypton fluoride (KrF), and the positive photoresist material is coated on the substrate 52 through a spin-coating method with a thickness of about 1.2 micrometers and baked under 140 degrees. Sequentially, as shown in FIG. 9, a recessing process is performed. For example, an etchant containing oxygen or fluorine is utilized to perform a dry etching process to remove the cap layer 68 above the surface of the pad layer 60 and a portion of the cap layer 68 on the upper portion 58 of the deep trench 54 so that a recess 70 is defined by the surface of the remained cap layer 68 and the inner surface of the upper portion 58 of the deep trench 54.

Figure 10:
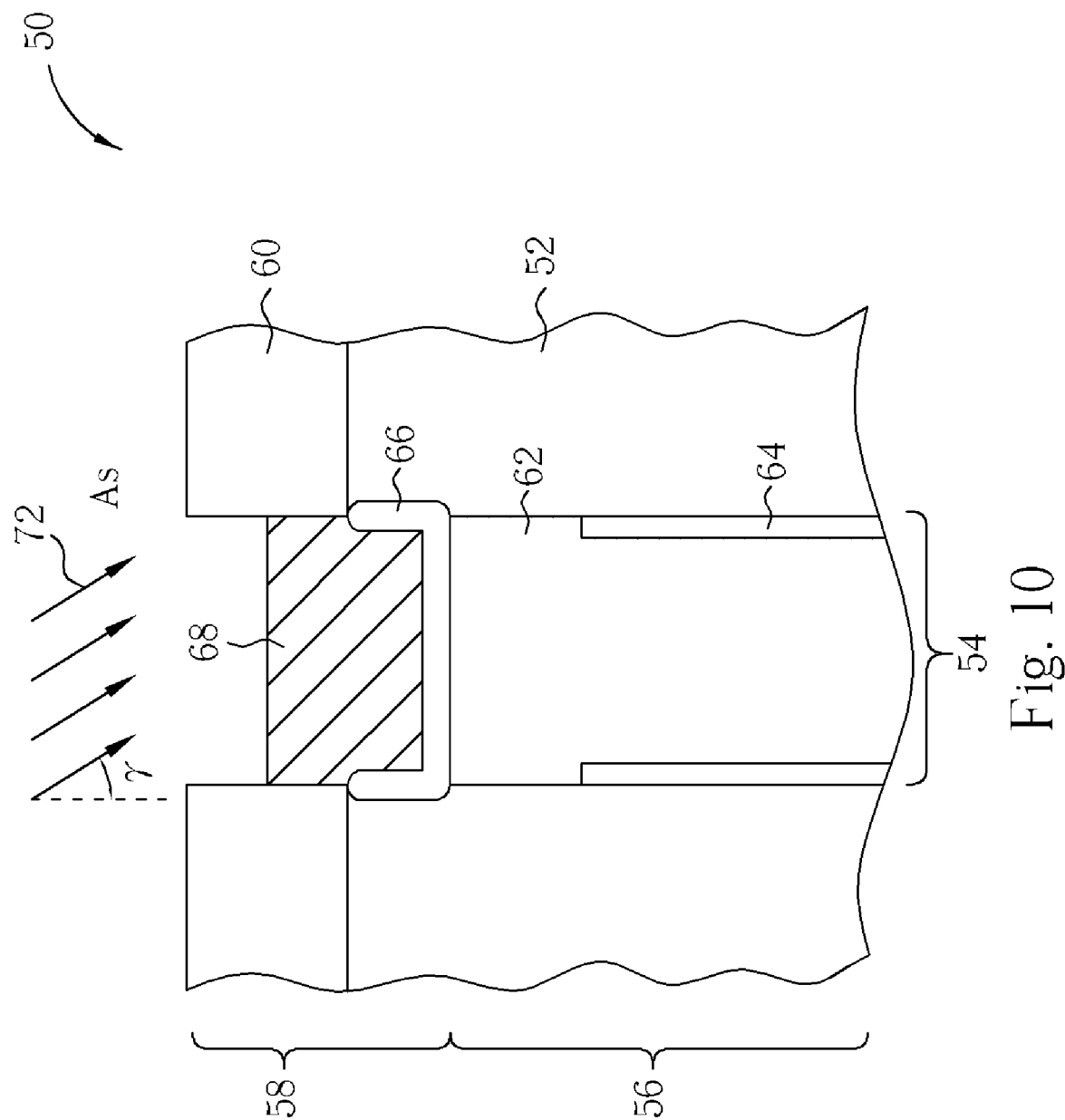

With reference to FIG. 10, a tilt angle implant process 72 is performed to implant ions, such as arsenic (As), boron fluoride ($BF_2+$), argon (Ar), phosphorous (P), etc., into the surface of the cap layer 68. In this embodiment, the implanted ions can be arsenic ions or phosphorous ions, and a dosage of the tilt angle implant process 72 is between about $1\times10^{14}$ ion/cm$^2$ to $1\times10^{16}$ ion/cm$^2$. For example, the dosage may be about $5\times10^{15}$ ion/cm$^2$ of arsenic ions or $1\times10^{16}$ ion/cm$^2$ of phosphorous ions, but not limited to this. The dosage can be adjusted according to different process requirements. Because the ions is implanted into the cap layer 68 with a predetermined tilt angle γ, and the upper portion 58 of the deep trench 54 has the recess 70, a portion of the cap layer 68 will be shielded by the inner sidewall of the upper portion 58 of the deep trench 54 and not be implanted with ions. In this embodiment, the tilt angle γ is preferred to be about 20 degrees to 26 degrees.

Figure 11:
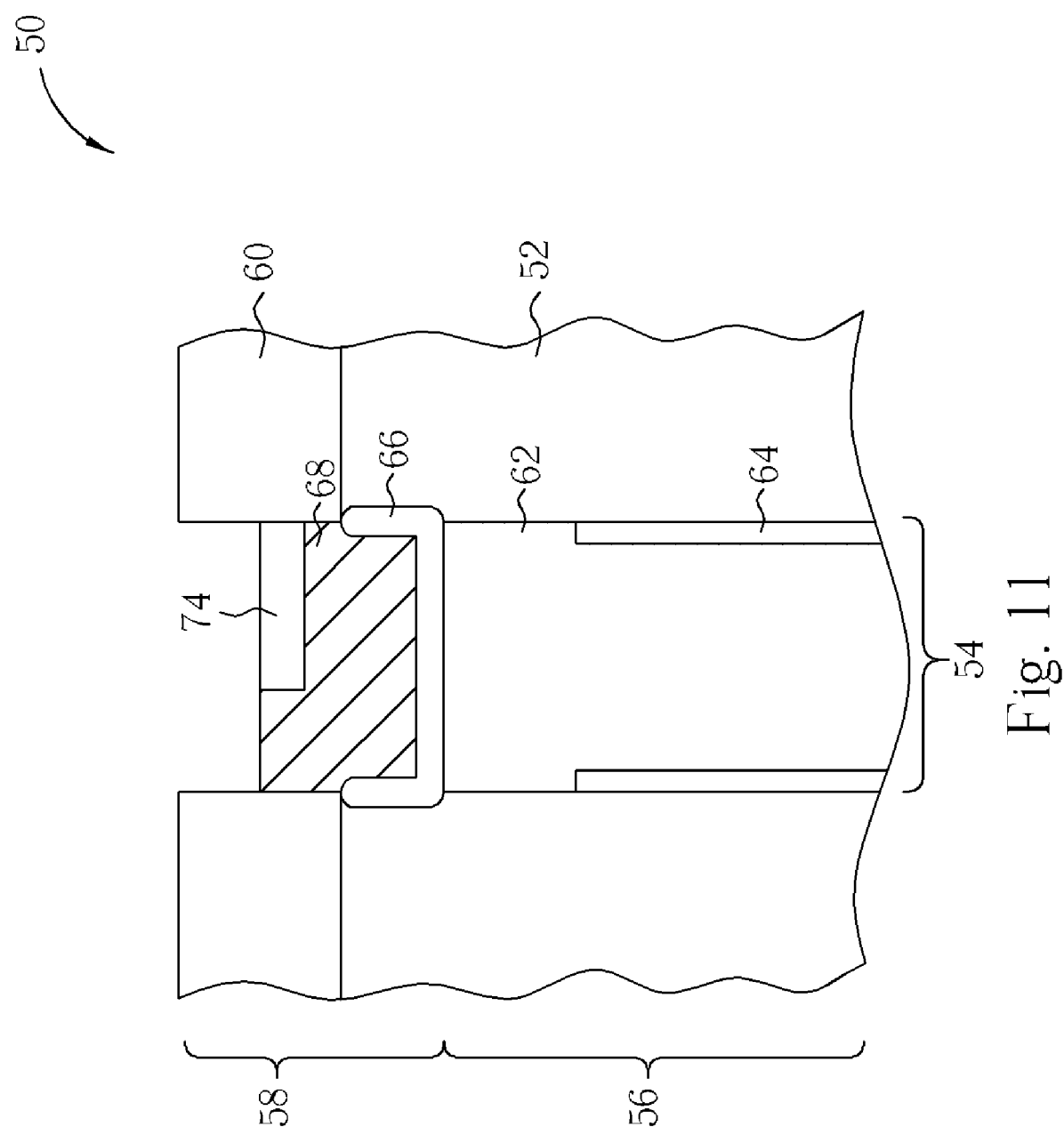

As shown in FIG. 11, the portion of the cap layer 68 implanted with ions becomes a thin crust layer 74, and the portion of the cap layer 68 not covered with the crust layer 74 forms a shallow trench pattern. Since the method of the present invention fills the deep trench 54 with the cap layer 68 and a recess 70 is defined before the tilt angle implant process is implemented, the sizes of the shallow trench pattern and the crust layer 74 can be determined by adjusting the thickness of the cap layer 68 after the recessing process coordinated with the tilt angle y and the process conditions, such as the implanting energy and dosage, etc. Accordingly, when the process level is getting smaller, the method of the present invention can easily adjust the thickness of the cap layer 68 or the depth of the recess 70 according to the size of the deep trench 54 so that the tilt angle γ still can be held at 20 degrees to 26 degrees to make the tilt angle implant process 72 have a large process window.

Figure 12:
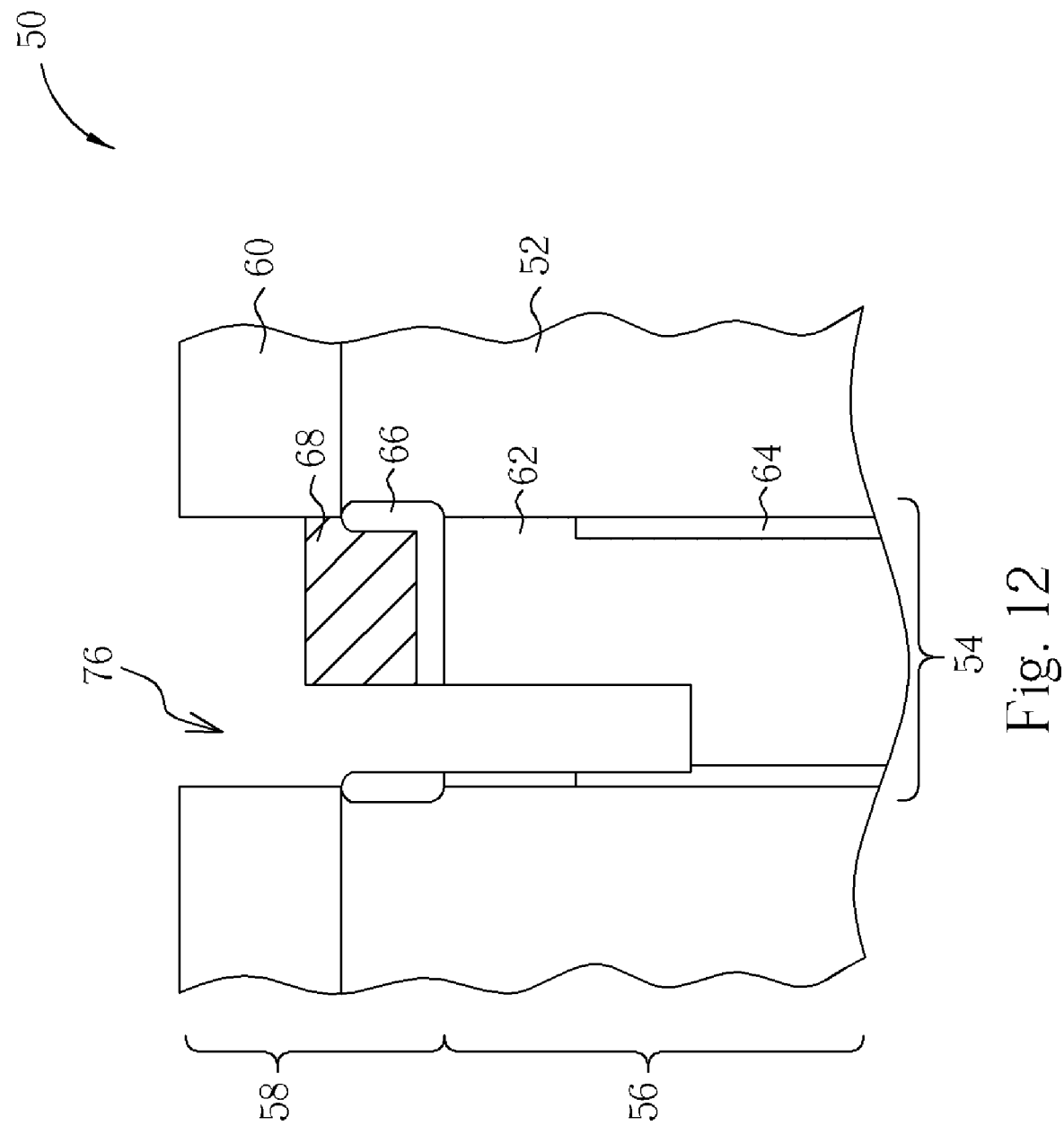

Next, with reference to FIG. 12, an etching process, such as a dry etching process, is practiced by utilizing an etchant of different property relative to the crust layer 74 and the cap layer 68 (such as a high etching ratio to the crust layer 74 and to the cap layer 68). During the etching process, the crust layer 74 is taken as an etching mask, and the portion of the cap layer 68 not covered by the crust layer 74 and the portion of the conductive layer 62 exposed by the removed cap layer 68 are sequentially removed through the shallow trench pattern to form a shallow trench 76, wherein a bottom surface of the shallow trench 76 is required to be lower than the top of the dielectric layer 64, such as about lower than 80 nanometers in this embodiment. In this etching process, an etchant comprising oxygen/nitrogen is first utilized to remove the cap layer 68 with organic or photoresist materials, and then the composition of the etchant can be adjusted to contain hydrogen bromide (HBr) to remove the isolation layer 66 and the conductive layer 62 by using the remained cap layer 68 as an etching mask so that this etching process can be performed in the same reaction chamber, which means this etching process is an in-situ etching process. In addition, the crust layer 74 may be removed simultaneously in this etching process.

With reference to FIG. 13, after forming the shallow trench 76, an etchant containing oxygen can be utilized to remove the remained cap layer 68 via a dry etching process. Last, as shown in FIG. 14 the shallow trench 76 is filled with another isolation layer, such as oxide layer, by a chemical vapor deposition (CVD) process. Then, a portion of the isolation layer is removed by utilizing the pad layer 60 as a stop layer during a chemical mechanical polishing (CMP) process so that the isolation shallow trench 78 is formed to allow the deep trench 54 to have a single side isolation structure. Sequentially, the pad layer 60 is removed, and a doped region 80 is formed on the surface of the substrate 52 in the sequential process. The doped region 80, opposite to the isolation shallow trench 78 relative to the isolation layer 66 and disposed at a side in the substrate 52 adjacent to the deep trench 54, is electrically connected to the conductive layer 62. The doped region 80 can serve as a source/drain of a transistor.

In summary, the method of the present invention can be applied to the fabrication process of a single side buried strap of DRAM, and also can be applied to other processes required to fabricate a partial structure or a hole in a recess or trench. According to the present invention, it is only required to fill a cap layer in the recess or trench, and then to define the pattern of the partial structure or hole by a tilt angle implant process so that the shape of the partial structure or hole can be formed with a following etching process. In comparison with the prior art, it is an advantage of the method of the present invention to form a cap layer and a recess in the upper portion of the deep trench at first so that ions can be implanted into the cap layer with a large tilt angle during the tilt angle implant process so as to increase the process window. According to the present invention, even if in the process under 60 nanometers, the tilt angle γ of the tilt angle implant process still can be hold at 20 degrees to 26 degrees, which is even higher than 10 degrees to 16 degrees of the angle α in the process of 90 nanometers according to the method in prior art of fabricating an isolation shallow trench. Therefore, the process difficulty can be efficiently reduced while the process yield is improved. Furthermore, according to the present invention, after the tilt angle implant process, it is only required one etching process to form a shallow trench in the deep trench so that the wet etching and oxidation processes can be ignored so as to have the advantages of simplifying process and raising process efficiency.

Those skilled in the art will readily observe that numerous modifications and alterations of the device and method may be made while retaining the teachings of the invention.

What is claimed is:

1. A method of fabricating an isolation shallow trench, comprising:
   providing a substrate with at least a deep trench having an upper portion and a lower portion, the lower portion of the deep trench being filled with a conductive layer;
   forming a cap layer on the substrate and filling the upper portion of the deep trench;
   partially removing the cap layer to leave a portion of the cap layer so that a top surface of the remaining cap layer is lower than that of the substrate;
   forming a crust layer from and on a part of the cap layer;
   defining a trench extending through the remaining cap layer and the conductive layer; and
   forming a first isolation layer in the trench so as to form the isolation shallow trench.

2. The method of fabricating an isolation shallow trench of claim 1, wherein the cap layer comprises an organic material.

3. The method of fabricating an isolation shallow trench of claim 2, wherein the organic material comprises a photoresist material.

4. The method of fabricating an isolation shallow trench of claim 3, wherein the organic material comprises a positive photoresist material adapted to a light source being krypton fluoride (KrF).

5. The method of fabricating an isolation shallow trench of claim 2, wherein in the crust layer forming step, a tilt angle implant process implants ions selected from the group consisting essentially of arsenic ions, boron fluoride ions or argon ions into a surface of the remaining cap layer.

6. The method of fabricating an isolation shallow trench of claim 5, wherein the tilt angle of the crust layer forming step is substantially about 20 degrees to 26 degrees.

7. The method of fabricating an isolation shallow trench of claim 5, wherein a dosage of the tilt angle implant process is between about $1\times10^{14}$ ion/cm$^2$ to $1\times10^{16}$ ion/cm$^2$ of arsenic ions or phosphorous ions.

8. The method of fabricating an isolation shallow trench of claim 5, wherein a dosage of the tilt angle implant process is about $5\times10^{15}$ ion/cm$^2$ of arsenic ions or $1\times10^{16}$ ion/cm$^2$ of the phosphorous ions.

9. The method of fabricating an isolation shallow trench of claim 1, wherein in the trench defining step, an etchant of an etching ratio between the crust layer and the cap layer is used to sequentially remove a part of the remaining cap layer free from the crust layer and a portion of the conductive layer exposed by the removed cap layer so as to perform an in-situ etching process.

10. The method of fabricating an isolation shallow trench of claim 1, wherein the crust layer is simultaneously removed in the trench defining step.

11. The method of fabricating an isolation shallow trench of claim 1, further comprising the steps of:
    removing the portion of the cap layer remained on the conductive layer before the first isolation layer is formed and after the shallow trench is formed.

12. The method of fabricating an isolation shallow trench of claim 1, wherein the substrate further comprises a second isolation layer disposed on a surface of the conducive layer and a surface of the sidewall of the upper portion of the deep trench.

13. The method of fabricating an isolation shallow trench of claim 12, wherein the second isolation layer comprises a nitride layer.

14. The method of fabricating an isolation shallow trench of claim 12, wherein the trench defining step sequentially removes a part of the portion of the cap layer not covered by the crust layer, portions of the second isolation layer and the conductive layer below the cap layer.

15. The method of fabricating an isolation shallow trench of claim 1, wherein the portion of the cap layer forming step further comprises:
    forming the cap layer on a surface of the substrate; and
    performing a recessing process to form a recess in the upper portion of the deep trench.

16. The method of fabricating an isolation shallow trench of claim 1, further comprising forming a doped region on the surface of the substrate disposed adjacent to a side of the deep trench, and the doped region is opposite to the trench and electrically connected to the conductive layer.

17. The method of fabricating an isolation shallow trench of claim 1, wherein in the trench defining step, a dry etching process is implemented.

18. The method of fabricating an isolation shallow trench of claim 17, wherein an etchant of the dry etching process comprises oxygen/nitrogen or hydrogen bromide.

19. The method of fabricating an isolation shallow trench of claim 1, further comprising adjusting thickness of the portion of the cap layer according to a size of the deep trench.

* * * * *